United States Patent
Song et al.

(10) Patent No.: US 10,970,128 B2
(45) Date of Patent: Apr. 6, 2021

(54) SERVER, AIR CONDITIONER AND METHOD FOR CONTROLLING THEREOF

(71) Applicant: Samsung Electronics Co., Ltd., Suwon-si (KR)

(72) Inventors: Hyungseon Song, Suwon-si (KR); Soonhyung Gwon, Seongnam-si (KR); Minkyong Kim, Suwon-si (KR); Tan Kim, Suwon-si (KR); Chandra Ashok Maloo, Suwon-si (KR); Dongjun Shin, Suwon-si (KR); Hyunwoo Ock, Suwon-si (KR); Hyeongjoon Seo, Suwon-si (KR); Youngju Joo, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 179 days.

(21) Appl. No.: 16/383,147

(22) Filed: Apr. 12, 2019

(65) Prior Publication Data
US 2019/0316794 A1    Oct. 17, 2019

Related U.S. Application Data

(60) Provisional application No. 62/657,126, filed on Apr. 13, 2018.

(30) Foreign Application Priority Data

Jul. 13, 2018    (KR) .................. 10-2018-0081877

(51) Int. Cl.
*G06F 9/50*    (2006.01)
*F24F 11/30*    (2018.01)
(Continued)

(52) U.S. Cl.
CPC ............ *G06F 9/5094* (2013.01); *F24F 11/30* (2018.01); *F24F 11/46* (2018.01); *F24F 11/56* (2018.01);
(Continued)

(58) Field of Classification Search
CPC ....... H05K 7/20836; G06F 1/20; G06F 1/206; G06F 9/5061; G06F 9/5094;
(Continued)

(56) References Cited

U.S. PATENT DOCUMENTS 5,211,332 A    5/1993    Adams
6,402,043 B1    6/2002    Cockerill
(Continued)

FOREIGN PATENT DOCUMENTS

CN    1427211 A    7/2003
CN    103942243 A    7/2014
(Continued)

OTHER PUBLICATIONS

Extended European Search Report dated May 23, 2019, issued in a counterpart European application No. 18753038.1-1205 / 3411634.
(Continued)

*Primary Examiner* — Crystal J Barnes-Bullock
(74) *Attorney, Agent, or Firm* — Jefferson IP Law, LLP

(57) ABSTRACT

A server is provided. The server includes a communication device configured to receive operation information from an air conditioner, a memory configured to store information of a plurality of groups and a cooling capacity prediction model for predicting a cooling capacity that corresponds to each of the plurality of groups, and a processor to map the air conditioner to one group among the plurality of groups based on the received operation information, and control the
(Continued)

communication device to enable the air conditioner to use the cooling capacity prediction model corresponding to the mapped group.

20 Claims, 11 Drawing Sheets

(51) Int. Cl.
| | |
|---|---|
| *F24F 11/58* | (2018.01) |
| *F24F 11/64* | (2018.01) |
| *F24F 11/65* | (2018.01) |
| *G05B 19/042* | (2006.01) |
| *G05B 15/02* | (2006.01) |
| *G05D 23/19* | (2006.01) |
| *G05B 13/04* | (2006.01) |
| *H05K 7/20* | (2006.01) |
| *G06N 20/00* | (2019.01) |
| *G06F 1/20* | (2006.01) |
| *F24F 11/56* | (2018.01) |
| *F24F 11/46* | (2018.01) |
| *F24F 11/62* | (2018.01) |
| *F24F 110/10* | (2018.01) |
| *F24F 110/40* | (2018.01) |
| *F24F 130/10* | (2018.01) |
| *F24F 140/50* | (2018.01) |

(52) U.S. Cl.
CPC .............. *F24F 11/58* (2018.01); *F24F 11/62* (2018.01); *F24F 11/64* (2018.01); *F24F 11/65* (2018.01); *G05B 13/04* (2013.01); *G05B 15/02* (2013.01); *G05B 19/042* (2013.01); *G05D 23/19* (2013.01); *G06F 1/206* (2013.01); *G06F 9/5061* (2013.01); *G06N 20/00* (2019.01); *H05K 7/20836* (2013.01); *F24F 2110/10* (2018.01); *F24F 2110/40* (2018.01); *F24F 2130/10* (2018.01); *F24F 2140/50* (2018.01); *G05B 2219/2614* (2013.01)

(58) Field of Classification Search
CPC ..... G06F 2119/08; G06N 20/00; G05B 13/04; G05B 15/02; G05B 19/042; G05B 2219/2614; G05D 23/19; F24F 11/30; F24F 11/46; F24F 11/56; F24F 11/58; F24F 11/62; F24F 11/64; F24F 11/65; F24F 2110/10; F24F 2110/40; F24F 2130/10; F24F 2140/50
See application file for complete search history.

(56) References Cited

U.S. PATENT DOCUMENTS

| | | | | |
|---|---|---|---|---|
| 7,958,219 | B2* | 6/2011 | Collins | G06F 9/5094 709/223 |
| 8,355,890 | B2* | 1/2013 | VanGilder | G06Q 50/32 702/182 |
| 8,523,082 | B2 | 9/2013 | Kammer et al. | |
| 8,639,482 | B2* | 1/2014 | Rasmussen | H05K 7/20836 703/5 |
| 9,753,465 | B1* | 9/2017 | Ghose | H04L 29/06 |
| 9,817,375 | B2* | 11/2017 | Li | F24F 11/62 |
| 10,012,965 | B2* | 7/2018 | Bartenbach | F24F 11/77 |
| 10,168,677 | B2* | 1/2019 | Funes | H04L 41/16 |
| 2006/0117767 | A1* | 6/2006 | Mowris | F25B 49/005 62/149 |
| 2007/0045444 | A1 | 3/2007 | Gray et al. | |
| 2008/0306632 | A1 | 12/2008 | Miki et al. | |
| 2012/0125559 | A1 | 5/2012 | Fadell et al. | |
| 2012/0126021 | A1 | 5/2012 | Warren et al. | |
| 2012/0221151 | A1 | 8/2012 | Steinberg | |
| 2013/0054758 | A1 | 2/2013 | Imes et al. | |
| 2013/0099011 | A1 | 4/2013 | Matsuoka et al. | |
| 2013/0318217 | A1 | 11/2013 | Imes et al. | |
| 2014/0074300 | A1 | 3/2014 | Shilts et al. | |
| 2014/0208219 | A1 | 7/2014 | Kim et al. | |
| 2015/0184881 | A1 | 7/2015 | Bartenbach et al. | |
| 2015/0248118 | A1 | 9/2015 | Li et al. | |
| 2016/0139575 | A1 | 5/2016 | Funes | |
| 2016/0178226 | A1 | 6/2016 | Daubman et al. | |
| 2016/0246269 | A1 | 8/2016 | Ahmed et al. | |
| 2018/0283723 | A1 | 10/2018 | Ock et al. | |
| 2019/0008072 | A1* | 1/2019 | Morgan | H05K 7/20836 |

FOREIGN PATENT DOCUMENTS

| | | |
|---|---|---|
| CN | 105717960 A | 6/2016 |
| JP | 5511698 B2 | 6/2014 |
| JP | 2016056973 A | 4/2016 |
| JP | 6106019 B | 3/2017 |
| JP | 6118975 B2 | 5/2017 |
| KR | 10-0134727 B1 | 1/1998 |
| KR | 10-2005-0030049 A | 3/2005 |
| KR | 10-0715999 B1 | 5/2007 |
| KR | 10-0765170 B1 | 10/2007 |
| KR | 10-2014-0045109 A | 4/2014 |
| KR | 20-0478906 Y1 | 11/2015 |
| KR | 10-1615977 B1 | 4/2016 |
| KR | 10-2016-0120607 A | 10/2016 |
| KR | 101800310 B1 | 11/2017 |
| KR | 10-2018-0112653 A | 10/2018 |
| WO | 2015014229 A1 | 2/2015 |
| WO | 2016-182434 A1 | 11/2016 |

OTHER PUBLICATIONS

Korean Office Action dated Jul. 3, 2019, issued in a counterpart Korean application No. 10-2018-0081877.
Hwang et al.; Load Forecasting using Hierarchical Clustering Method for Building; The Transactions of the Korean Institute of Electrical Engineers vol. 64, No. 1, pp. 41-47, 2015. ISSN 1975-8359(Print) / ISSN 2287-4364(Online); http://dx.doi.org/10.5370/KIEE.2015.64.1.041.
International Search Report dated Jul. 17, 2018, issued in International Application No. PCT/KR2018/003774.
Written Opinion Search Report dated Jul. 17, 2018, issued in International Application No. PCT/KR2018/003774.
European Office Action dated Feb. 5, 2020, issued in a counterpart European Application No. 18 753 038.1-1205.
U.S. Office Action dated Dec. 14, 2020, issued by the U.S. Patent and Trademark Office; U.S. Appl. No. 15/941,687.
Chinese Office Action dated Dec. 25, 2020, issued by a counterpart Chinese Application No. 201880022241.2.
Summons to Oral Proceedings dated Oct. 30, 2020, issued in a counterpart European Application No. 18753038.1.
Summons to oral proceedings dated Nov. 20, 2020, issued in a counterpart European Application No. 18753038.1.

\* cited by examiner

FIG. 9

| No. | Mode | CoMode | Speed Level1 | Cooling Capacity |
|---|---|---|---|---|
| 1 | Cool | Sleep | - | 10800 |
| 2 | Cool | - | 4 | 10200 |
| 3 | Dry | - | 0 | 10200 |
| 4 | Wind | - | 0 | 300 |

FIG. 11

| No. | Cooling Capacity | Mode | Temp(cT-dT) |
|---|---|---|---|
| 1 | CC >= 9700 | Comode_Speed | NA |
| 2 | 4817 >= CC > 4386 | Dry | >3 |
| 3 | 4386 >= CC > 3621 | Dry | 2 |
| 4 | 3621 >= CC > 2448 | Dry | 1 |

SERVER, AIR CONDITIONER AND METHOD FOR CONTROLLING THEREOF

CROSS-REFERENCE TO RELATED APPLICATION(S)

This application is based on and claims priority under 35 U.S.C. § 119(e) of a U.S. Provisional application Ser. No. 62/657,126, filed on Apr. 13, 2018, in the U.S. Patent and Trademark Office, and under 35 U.S.C. § 119(a) of a Korean patent application number 10-2018-0081877, filed on Jul. 13, 2018, in the Korean Intellectual Property Office, the disclosure of which is incorporated by reference herein in its entirety.

BACKGROUND

1. Field

The disclosure relates to an air conditioner and a controlling method thereof. More particularly, the disclosure relates to a server for predicting cooling tendency of a user using usage information of air conditioners having similar usage patterns, an air conditioner, and a controlling method thereof.

2. Description of Related Art

An air conditioner may perform a cooling operation according to temperature, humidity, wind volume, or the like, directly set by a user. Recently, by learning a user's setting information with an artificial intelligence (AI) model, the air conditioner may perform a cooling operation according to a cooling tendency of a user without setting temperature, humidity, wind volume, or the like, directly by the user.

In the related art, there is an increase in the amount of models to be learned as the number of air conditioners increases by generating a model for each air conditioner, thereby significantly increasing the overhead of a batch process for learning.

In addition, in the related art, due to the characteristics of the air conditioner in which a user directly operates the temperature, humidity, wind volume, and the like in a small number, the user's setting information for learning by the AI model is insufficient, and there is an inconvenience that predicting user's cooing tendency is difficult.

Accordingly, there is necessity of technology to complement the inefficiency of learning by each air conditioner and accurately predict the cooling tendency of a user despite insufficient setting information of a user.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide a server which predicts a cooling tendency of a user by using usage information of air conditioners having similar usage patterns, an air conditioner, and a controlling method thereof.

Additional aspects will be set forth in part in the description which follows and, in part, will be apparent from the description, or may be learned by practice of the presented embodiments.

In accordance with an aspect of the disclosure, a server is provided. The server includes a communication device configured to receive operation information from an air conditioner, a memory configured to store information of a plurality of groups and a cooling capacity prediction model for predicting a cooling capacity that corresponds to each of the plurality of groups, and a processor to map the air conditioner to one group among the plurality of groups on a basis of the received operation information, and control the communication device to enable the air conditioner to use the cooling capacity prediction model corresponding to the mapped group.

In accordance with another aspect of the disclosure, an air conditioner is provided. The air conditioner includes an air cooler configured to perform air conditioning, a communication device configured to communicate with a server, a processor to control the communication device to transmit operation information of the air conditioner to the server, and receive information on a cooling capacity predicted on a basis of the transmitted operation information, generate control data on the air cooler based on the received information on the cooling capacity, and control the air cooler based on the generated control data.

In accordance with another aspect of the disclosure, a controlling method is provided. The controlling method includes storing information of a plurality of groups and a cooling capacity prediction model for predicting a cooling capacity that corresponds to each of the plurality of groups, receiving operation information from an air conditioner, mapping the air conditioner to one group among a plurality of groups on a basis of the received operation information, predicting the cooling capacity of the air conditioner using the cooling capacity prediction model corresponding to the mapped group, and transmitting information on the predicted cooling capacity to the air conditioner.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 9 is a view illustrating an example of the cooling capacity according to an embodiment of the disclosure;

FIG. 11 is a view illustrating an example of an operation mode and temperature conversion according to an embodiment of the disclosure.

Throughout the drawings, like reference numerals will be understood to refer to like parts, components, and structures.

DETAILED DESCRIPTION

Figure 1:
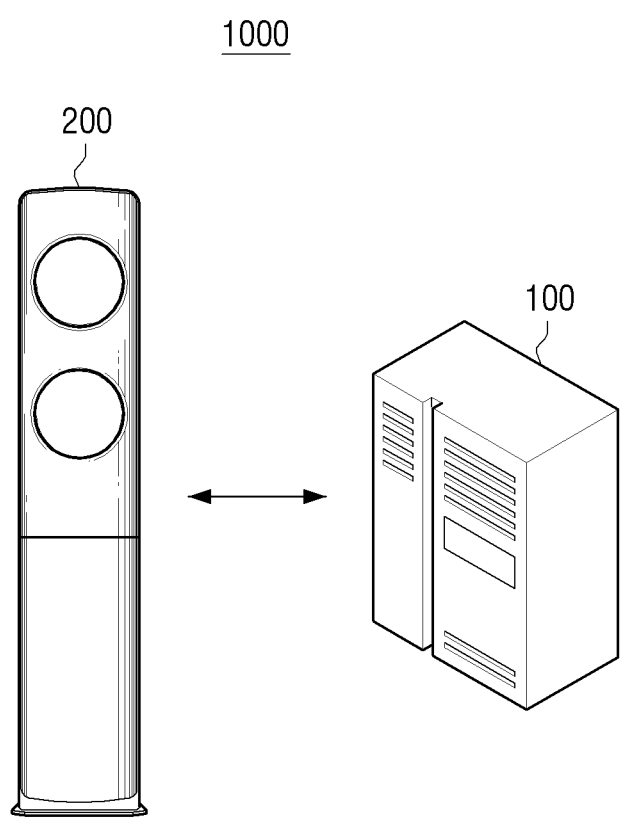
FIG. 1 is a view provided to describe an air conditioning system according to an embodiment of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Since the disclosure may be variously modified and have several embodiments, specific embodiments of the disclosure will be illustrated in the drawings and be described in detail in the detailed description. However, it is to be understood that the disclosure is not limited to specific embodiments, but includes all modifications, equivalents, and substitutions without departing from the scope and spirit of the disclosure. When it is decided that a detailed description for the known art related to the disclosure may obscure the gist of the disclosure, the detailed description will be omitted.

Singular forms are intended to include plural forms unless the context clearly indicates otherwise. It will be further understood that terms "include" or "formed of" used in the specification specify the features, numerals, operations, components, parts, or combinations thereof mentioned in the specification, but do not preclude the presence or addition of one or more other features, numerals, operations, components, parts, or combinations thereof.

In the disclosure, the term "air conditioner" refers to a device that is disposed in a space such as a house, office, shop, and a house where crops are grown, to control temperature of air, humidity, cleanliness, and air flow so as to maintain a pleasant indoor environment for living of people or an indoor environment suitable for growing crops. Examples of the air conditioner include a domestic air conditioner for a household, a system air conditioner, a car air conditioner, a dehumidifier, an air cooler, an air purifier, and the like.

The above and other aspects, features and other advantages of the disclosure will be more clearly understood from the following detailed description taken in conjunction with the accompanying drawings. The disclosure may, however, be embodied in many different forms and should not be construed as limited to the embodiments set forth herein. In addition, in order to clearly illustrate the disclosure in the drawings, portions which are not related to the description have been omitted.

Hereinbelow, the disclosure will be further described with reference to the drawings.

FIG. 1 is a view provided to describe an air conditioning system according to an embodiment of the disclosure.

Referring to FIG. 1, an air conditioning system 1000 includes an air conditioner 200 and a server 100.

The air conditioner 200 performs an operation for conditioning the indoor air. Specifically, the air conditioner 200 may perform at least one of air conditioning including cooling for lowering the temperature of the indoor air, heating for raising the temperature of the indoor air, blowing air for forming the indoor air current, and dehumidifying for lowering the indoor humidity.

The air conditioner 200 may perform an operation according to a control command set by a user. The air conditioner 200 may perform an operation without user's setting based on control command information set by a user in the past.

Specifically, the air conditioner 200 may learn the usage pattern of a user by using the past operation information, predict an appropriate operation for the user in a given situation, and perform the corresponding operation. In addition, the air conditioner 200 may transmit the operation information to the external server 100, receive the prediction result of the operation from the server 100 that has learned the transmitted operation information, and perform the operation accordingly.

Here, the operation information may include not only the desired temperature, the operation mode, the wind direction, and the wind speed set by the user but also the ambient temperature, the ambient humidity, and the like. In addition, the operation information may be generated for each event such as an input operation of each user or a state change of the air conditioner 200.

The server 100 means a server computer or a server program that provides information or a service to a client through a network. The server 100 may receive operation information from the air conditioner 200 or sensing data sensed by the air conditioner 200. In addition, the server 100 may receive weather information from a server (not shown) having weather information about a place where the air conditioner 200 is located.

The server 100 may identify the usage pattern of the user based on the received operation information, and upon receiving a request for the prediction information from the air conditioner 200, may obtain prediction information with respect to an operation corresponding to the identified usage pattern. The server 100 may identify the usage pattern of the user using the pre-stored artificial intelligence (AI) model and obtain the prediction information. The specific configuration and operation of the server will be described later with reference to FIGS. 2 and 3.

AI model may be composed of machine learning and element technologies that utilize machine learning. Machine learning is an algorithm technology that classifies or learns the characteristics of input data. Element technology is a technology that simulates functions, such as recognition and determination of human brain using machine learning algorithms, such as deep learning, composed of linguistic understanding, visual understanding, reasoning or prediction, knowledge representation, motion control, etc. Details of an operation to obtain prediction information using the AI model will be described with reference to FIG. 2 in relation to an operation of the server 100.

The server 100 may transmit the obtained prediction information to the air conditioner 200. The air conditioner 200 may receive the prediction information from the server 100 and perform an operation corresponding to the prediction information. The specific configuration and operation of the air conditioner will be described later with reference to FIGS. 4 and 5.

As such, the air conditioning system 1000 may analyze a user's usage pattern based on the operation information of the user, perform an operation corresponding thereto, and provide air conditioning service optimized to a user.

In describing FIG. 1, it has been described that a single air conditioner is connected to a server. However, in implementation, the server may be connected to a plurality of air conditioners. In addition, the server and the air conditioner may be directly connected or connected via other configurations such as a router.

Figure 2:
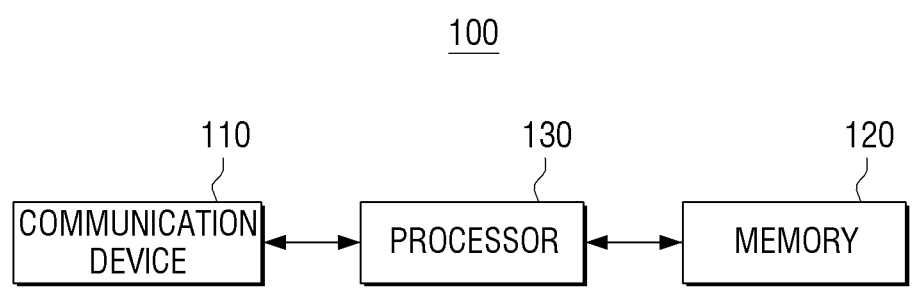
FIG. 2 is a block diagram illustrating a simple configuration of a server according to an embodiment of the disclosure.

FIG. 2 is a block diagram illustrating a simple configuration of a server according to an embodiment of the disclosure.

Referring to FIG. 2, the server 100 includes a communication device 110, a memory 120, and a processor 130.

The communication device may exchange data with an external device in a wired or wireless manner. Specifically, the communication device 110 may be connected to an external device in a wireless manner such as a wireless local area network (LAN), a Bluetooth, or the like. In addition, the communication device 110 may be connected to an external device using Wi-Fi, Bluetooth, or ZigBee. Meanwhile, the communication device 110 may include a wired connection port.

The communication device 110 may communicate with a plurality of air conditioners 200. The communication device 110 may receive, from each air conditioner 200, operation information or sensing data sensed by the air conditioner 200.

The communication device 110 may communicate with an external server (not shown) that provides external environment information. For example, the communication device 110 may receive weather information, such as temperature or humidity, according to date and time from an external server providing weather information.

The communication device 110 may transmit the prediction model acquired by the operation of the processor 130, which will be described later, to the air conditioner 200. In addition, cooling capacity predicted by the obtained prediction model or control data for the air conditioner 200 corresponding to the cooling capacity may be transmitted.

The cooling capacity is an index relating to the ability of the cooling system to remove heat, and the operation of predicting the cooling capacity and the control data corresponding to the cooling capacity will be described in detail in FIGS. 10 and 11.

The memory 120 stores various programs and data required for an operation of the server 100. To be specific, the memory 120 may store at least one command. The processor 130 may execute the operation described above by executing a command stored in the memory 120.

The memory 120 may be implemented as a non-volatile memory, a volatile memory, a flash memory, a hard disk drive (HDD), a solid state drive (SSD), and the like. The memory 120 is accessed by the processor 130, and the reading, recording, modifying, deleting, and updating of the data may be performed by the processor 130. In this disclosure, the term memory may include the memory 120, the read-only memory (ROM) (not shown), random access memory (RAM) (not shown), or a memory card (not shown) (for example, micro secure digital (SD) card, memory stick) mounted to the server 100.

The memory 120 may store the operation information received from each of the plurality of air conditioners 200 and a usage pattern of the user which is identified based on the received operation information. Also, the memory 120 may store information on a plurality of groups a prediction model corresponding to each group.

The plurality of groups is a group generated by analyzing the usage pattern of each air conditioner on the basis of the operation information on each of the plurality of air conditioners 200 that may communicate with the server 100, and grouping the air conditioners having similar usage pattern into a group.

For example, a plurality of air conditioners may be classified into a group favoring a low temperature operation of 20 degrees or lower, or a group favoring a strong wind operation, and the like. Meanwhile, a plurality of groups may be classified into groups according to various methods, in addition to the above-described examples. The term group is used in the disclosure, but it may also be referred to as a cluster, a gathering, or the like.

The memory 120 may store an AI model that maps the air conditioner 200 into one group among the plurality of groups described above. The AI model may correspond to a classification prediction model that classifies clusters with respect to data based on the similarity.

Specifically, the AI model learns the usage pattern based on the operation information of each of the plurality of air conditioners, and when the received operation information is inputted, the AI model may map the air conditioner 200 to a group corresponding to the usage pattern of the air conditioner 200 from among a plurality of groups.

The classification prediction model may include K-means model, partitioning, K-medoid, clustering LARge application (CLARA), clustering large application based RAND search (CLARANS) model, or the like. Here, the K-means model is a method of classifying data into K groups. By dividing the data into arbitrary K groups, setting the centroid of each group, calculating distance between the data of each group and the centroid, and repeatedly resetting the group in a direction in which the variance value for this distance is minimized, a group is formed.

The prediction model corresponding to each of the plurality of groups is an AI model which may learn operation information of the air conditioner belonging to each of a plurality of groups and provide prediction information for an estimated operation which seems suitable for a given situation. The AI model may be a regression model which performs modeling the correlation between dependent variable and independent variable.

The regression model may include a linear regression, polynomial regression, decision tree regression, random forest regression, or the like.

For example, in the case of a prediction model corresponding to a group favoring a low temperature of 20 degrees or below, prediction information may be provided so that the air conditioner operates at a low temperature of 20 degrees or below. The prediction information provided by the prediction model may include information on the set temperature, the operation mode, the wind direction or the wind speed, or the cooling capacity information. Hereinafter, a model for providing prediction information including cooling capacity information will be referred to as a cooling capacity prediction model.

The processor 130 controls overall operations and functions of the server 100. To be specific, the processor 130 may be implemented as a central processing unit (CPU), application-specific integrated circuit (ASIC), or the like. Furthermore, the processor 130 may be composed of a plurality of CPUs.

When receiving operation information from the air conditioner 200 through the communication device 110, the processor 130 may map the air conditioner 200 into a group from among a plurality of groups based on the received operation information.

Specifically, the processor 130 may input the received operation information to the AI model stored in the memory 120, and map the air conditioner 200 into one group of the plurality of groups according to the calculation result of the AI. The AI model used herein means the above-described classification prediction model.

The operation information may include not only the desired temperature, the operation mode, the wind direction, and the wind speed set by the user but also the ambient temperature, the ambient humidity, and the like. In addition, the operation information may be generated for each event such as an input operation of each user or a state change of the air conditioner 200.

The processor 130 may calculate cooling capacity of the air conditioner 200 using at least one of the temperature information, the operation mode information and the wind volume information set by the user, and map the air conditioner 200 to one of the plurality of groups based on the calculated cooling capacity and the received operation information. The method of calculating the cooling capacity will be described later with reference to FIG. 9.

The processor 130 may generate a prediction model which corresponds to each of the plurality of groups. The prediction model may include a cooling capacity prediction model.

Specifically, the processor 130 may generate a prediction model for each of the plurality of groups using the operation information of the air conditioner corresponding to each of the plurality of groups. At this time, the prediction model may correspond to a regression model.

For example, if the operation information of 100 air conditioners is stored in the memory 120, and there are a total of three groups, the processor 130 may generate a prediction model for a group 1 using operation information of the air conditioner belonging to group 1, a prediction model for a group 2 using operation information of the air conditioner belonging to group 2, and a prediction model for a group 3 using operation information of the air conditioner belonging to a group 3.

More specifically, the processor 130 may generate a prediction model for the mapped group using the operation information corresponding to the group to which the air conditioner 200 is mapped and the received operation information of the air conditioner 200 among the stored operation information of the air conditioner 200.

For example, when the air conditioner 200 is mapped to group 1, the processor 130 may control the communication device 110 so that the air conditioner 200 uses the prediction model corresponding to group 1, and generate a prediction model for group 1 using the operation information of group 1 from among the operation of the 100 air conditioners 200 and the received operation information of the air conditioner 200.

As another embodiment, the processor 130 may update the prediction model corresponding to the group to which the air conditioner 200 is mapped using the received operation information of the air conditioner 200, and control the communication device 110 to enable the air conditioner 200 to use the updated prediction model.

For example, when the air conditioner 200 is mapped to group 1, the processor 130 may update the prediction model of group 1 using the received operation information of the air conditioner 200, and control the communication device 110 such that the air conditioner 200 uses the updated prediction model.

When completing the mapping with respect to the air conditioner 200, the processor 130 may control the communication device 110 to use the prediction model corresponding to the mapped group.

Specifically, the processor 130 may control the communication device 110 to transmit the prediction model itself corresponding to the mapped group to the air conditioner 200. In this case, the air conditioner 200 may directly perform the operation prediction for a given situation using the received prediction model. In addition, since the prediction model includes the cooling capacity prediction model, the air conditioner 200 may predict the cooling capacity for the given situation.

As yet another embodiment, the processor 130 may generate the prediction information with respect to the air conditioner 200 based on the prediction model corresponding to the mapped group and the received operational information, and control the communication device 110 to transmit the generated information to the air conditioner 200. For example, information on the predicted temperature, mode, or wind speed may be transmitted to the air conditioner 200 using the prediction model. In addition, since the prediction model includes the cooling capacity prediction model, the processor 130 may transmit the cooling capacity information predicted using the cooling capacity prediction model to the air conditioner 200.

In another embodiment, the processor 130 may predict a cooling capacity for the air conditioner 200 based on the cooling capacity prediction model corresponding to the mapped group and the received operation information, generate the control data for the air conditioner 200 corresponding to the predicted cooling capacity, and control the communication device 110 to transmit the generated control data to the air conditioner 200. Here, the control data means data for controlling the air conditioner 200 to operate at a specific set temperature, operation mode or wind volume.

The processor 130 may use cooling capacity in various ways. Conventionally, as information necessary for the air conditioner 200 to perform an operation suitable for a given situation, information on the set temperature, the operation mode, the wind volume, or the wind speed is individually predicted, but there is a problem that a lot of resources are required for predicting all information.

However, as described above, when the processor 130 predicts a cooling capacity and converts it into control data such as set temperature or operation mode information corresponding to the predicted cooling capacity, only the cooling capacity is predicted and thus, there is an effect that the operation of the air conditioner 200 may be controlled with only small resources. The information on the temperature or operation mode corresponding to the predicted cooling capacity will be described later in FIG. 11.

Conventionally, when a prediction model is generated, the prediction model for each air conditioner is generated based only on the operation information of each air conditioner. However, since the user tends not to change the setting for a long time after setting the operation of the air conditioner, the number of times of user's operation of the air conditioner is not large, and accordingly, the data amount which is a basis for generating a prediction model of each air conditioner is not sufficient. Therefore, there is a problem of generating an overfitted prediction model.

However, as described above, in the disclosure, air conditioners having similar usage patterns are grouped based on the operation information of the air conditioner, and a prediction model is generated using operation information of air conditioner belonging to each group. Therefore, there is a sufficient amount of data for generating the prediction model, and there is an effect that a prediction model with high accuracy may be generated.

Figure 3:
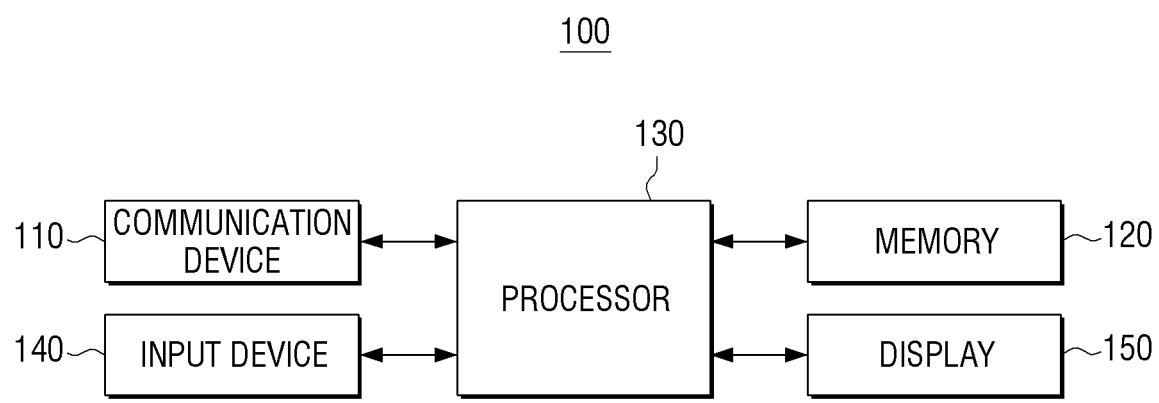
FIG. 3 is a block diagram illustrating a specific configuration of a server according to an embodiment of the disclosure.

FIG. 3 is a block diagram illustrating a specific configuration of a server according to an embodiment of the disclosure.

Referring to FIG. 3, the server 100 may include the communication device 110, the memory 120, the processor 130, an input device 140, and a display 150.

The configurations of the communication device 110, the memory 120, and the processor 130 are the same as the configurations of FIG. 2 and will not be described.

The input device 140 may receive a function selection and a control command for the function from the user. Here, the function may include a communication function, a storage function, a mapping function, an information selection function, a prediction model generation function, or the like.

Specifically, the input device 140 may receive a selection of the air conditioner 200 for communication from the user, and may receive a selection regarding whether to store the operation information received from the air conditioner 200.

Further, the input device 140 may receive a selection of whether to perform mapping for a plurality of groups to the specific air conditioner 200, and may receive a user's selection of how to generate a prediction model.

In classifying a plurality of air conditioners into a plurality of groups, the input device 140 may receive information regarding how many groups will be classified.

The input device 140 may receive an input through a menu displayed on the display 150.

The input device 140 may be implemented as a plurality of buttons, a keyboard, a mouse, or the like, or may be implemented as a touch screen capable of simultaneously performing functions of the display 150.

The display 150 may display various messages provided by the server 100. For example, the display 150 may display a user interface window for receiving selection of various functions provided by the server 100. The display 150 may be a monitor such as a liquid crystal display (LCD), a cathode-ray tube (CRT), or an organic light-emitting diode (OLED), or may be implemented as a touch screen capable of simultaneously performing the functions of the input device 140.

Figure 4:
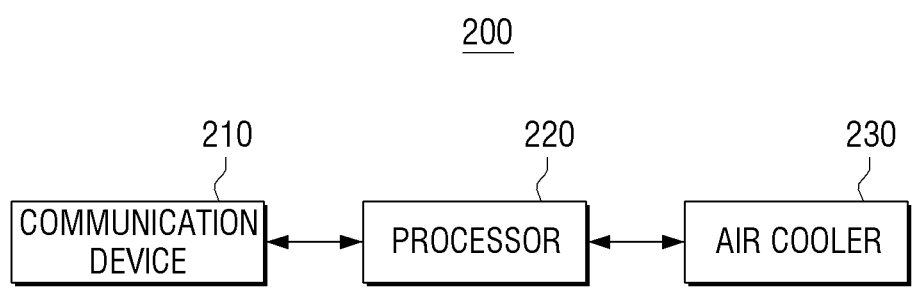
FIG. 4 is a block diagram illustrating a simple configuration according to an embodiment of the disclosure.

FIG. 4 is a block diagram illustrating a simple configuration according to an embodiment of the disclosure.

Referring to FIG. 4, the air conditioner 200 includes a communication device 210, a processor 220, and an air cooler 230.

The communication device 210 may communicate with an external device using various communication methods. Specifically, the communication device 210 may be connected to an external device in a wireless manner such as a wireless LAN, a Bluetooth, or the like. In addition, the communication device 210 may be connected to an external device using Wi-Fi, Bluetooth, or ZigBee. Meanwhile, the communication device 110 may include a wired connection port.

The communication device 210 may be connected to a terminal device (not shown) such as a mobile device (smart phone, tablet personal computer (PC)), PC, notebook PC, and the like, and receive data from the terminal device (not shown).

The communication device 210 may communicate with the server 100. The communication device 210 may transmit the operation information of the air conditioner 200 to the server 100. The operation information may include current temperature, current humidity, desired temperature, mode information, operation time, and the like. In addition, operation information may be generated for each event such as input of each user or state change of the air conditioner 200.

The communication device 210 may receive a prediction model based on the transmitted operation information from the server 100. The prediction model may include a cooling capacity prediction model.

The communication device 210 may receive a cooling capacity predicted from the prediction model based on the transmitted operation information from the server 100.

The communication device 210 may receive control data corresponding to the predicted cooling capacity from the prediction model based on the transmitted operation information, from the server 100.

The processor 220 controls each configuration in the air conditioner 200. To be specific, the processor 220 may be implemented as a CPU, an ASIC, or the like.

The processor 220 may control the operation information including the temperature information and the operation mode information set by the user of the air conditioner 200 to be stored in a memory 250 and control the communication device 210 to transmit the operation information to the server 100.

Also, the processor 220 may calculate the cooling capacity using at least one of the temperature information, the operation mode information, and the wind volume information set by the user, and control the communication device 210 to transmit the calculated cooling capacity to the server 100. The method of calculating the cooling capacity will be described later with reference to FIG. 9.

The processor 220 may control the operation of the air cooler 230 using the prediction model received by the communication device 210 from the server 100. Specifically, the processor 220 may predict a suitable operation corresponding to a given situation using the received prediction model, and may control the air cooler 230 to perform an operation corresponding to the predicted result.

When the communication device 210 receives the cooling capacity prediction model, the processor 220 may predict the cooling capacity corresponding to the given situation using the received cooling capacity prediction model, generate control data including the set temperature or mode information using the cooling capacity, and control the air cooler 230 using the generated control data. A method of calculating the set temperature or mode information corresponding to the cooling capacity will be described with reference to FIG. 11.

The processor 220 may control the operation of the air cooler 230 by using the prediction information received by the communication device 210 from the server 100. Specifically, the processor 220 may control the air cooler 230 to perform a corresponding operation using the set temperature or the operation mode information included in the received prediction information.

When the communication device 210 receives predicted cooling capacity information, the processor 220 may generate the control data including the set temperature, mode information, or the like, and control the air cooler 230 using the generated control data.

When the communication device 210 receives control data from the server 100, the processor 220 may control the operation of the air cooler 230 using the received control data.

The air cooler 230 may perform a cooling operation of the air conditioner 200. The air cooler 230 may perform the cooling operation according to the user command inputted through the remote controller or a user interface device 270 of the air conditioner 200.

Even there is no user command directly input, the air cooler 230 may perform the cooling operation according to control of the processor 220.

For convenient description, the feature of controlling the temperature of the air is referred to as the air cooler 230, but the configuration is not limited to cooling, and at least one air conditioning from among heating to raise the temperature of the room air, wind blowing to form air current indoor, dehumidification for lowering the indoor humidity may be performed. In addition, the air cooler 230 may include an outdoor unit as well as an indoor unit of the air conditioner 200.

Figure 5:
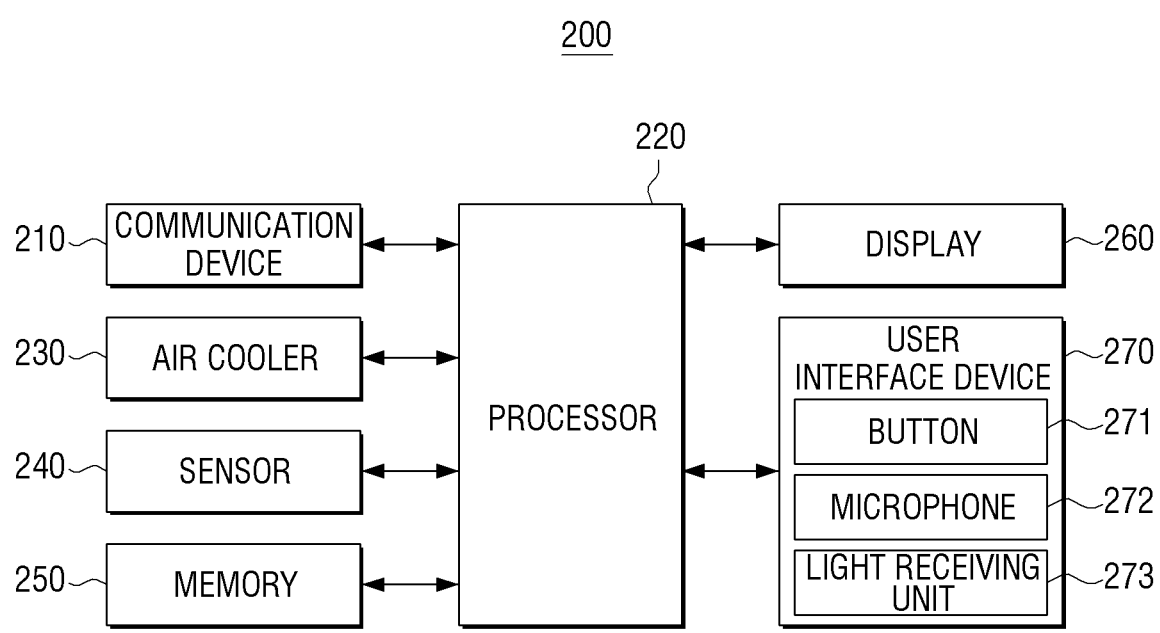
FIG. 5 is a block diagram illustrating a specific configuration of an air conditioner according to an embodiment of the disclosure.

FIG. 5 is a block diagram illustrating a specific configuration of an air conditioner according to an embodiment of the disclosure.

Referring to FIG. 5, the air conditioner 200 may include the communication device 210, the processor 220, the air cooler 230, a sensor 240, a memory 250, a display 260, and a user interface device 270.

The configuration of the communication device 210, the processor 220, and the air cooler 230 is the same as the configuration of FIG. 4, and will not be further described.

The sensor 240 may acquire various information of an area where the air conditioner 200 is located. For example, the sensor 240 may include a temperature sensor, a humidity sensor, and the like. The sensor 240 may sense the temperature of the space in which the air conditioner 200 is disposed through the temperature sensor, or sense the humidity of the space in which the air conditioner 200 is disposed through the humidity sensor. In addition, the sensor 240 may include an infrared (IR) sensor, a proximity sensor or a camera for detecting a user.

The memory 250 may store instructions or data related to at least one other component of the air conditioner 200. In particular, the memory 250 may be implemented as a non-volatile memory, a volatile memory, a flash memory, a HDD, or a SSD. The memory 250 is accessed by the processor 220 and reading/writing/modifying/deleting/updating of data by the processor 220 and the like may be performed. The term memory in this disclosure may include the memory 250, ROM (not shown), RAM (not shown) in the processor 220, and a memory card (not shown) (for example, micro SD card, memory stick) mounted to the air conditioner 200.

Specifically, the memory 250 may store user operation information on the air conditioner 200 or data sensed by the sensor 240. Further, the memory 250 may store the prediction model, the cooling capacity prediction model, the cooling capacity information, or the control data received from the server 100 through the communication device 210.

The display 260 may be provided on the outer surface of the air conditioner 200 and display data. Specifically, the display 260 may be implemented as various types of displays such as a LCD, an OLED display, and a plasma display panel (PDP). The display 260 may include a driving circuit, a backlight unit, and the like, which may be implemented in the form of an a-si thin film transistor (TFT), a low temperature poly silicon (LTPS) TFT, an organic TFT (OTFT). The display 260 may also be implemented as a flexible display.

The display 260 may display various information provided by the air conditioner 200. Specifically, the display 260 may display a user interface screen for receiving selection of various functions provided by the air conditioner 200, or may be implemented as a touch screen for receiving user input.

In addition, the display 260 may provide information on the operation currently performed by the air conditioner 200 and data sensed by the air conditioner 200. For example, the display 260 may provide information on the operation of the air conditioner 200, such as the current temperature measured at the time when the air conditioner 200 is operating, the current humidity, as well as the set temperature, wind volume, wind speed, or the like.

The user interface device 270 is a configuration for receiving user interaction such as a user's operation. Specifically, the user interface device 270 may receive a control command for the set temperature, the operation mode, or the wind volume of the air conditioner 200 from the user.

The user interface device 270 may include a button 271 formed in an arbitrary area such as a front surface portion, a side surface portion and a back surface portion of the outer surface of the main body of the air conditioner 200, a microphone 272 for receiving user's voice, a light receiving unit 273 that receives an optical signal corresponding to a user input (e.g., touch, press, touch gesture, voice, or motion) from the remote controller, and the like. Meanwhile, if the display 260 is a touch screen, the display 260 may also operate as the user interface device 270.

Though not illustrated in FIG. 5, according to embodiments, a universal serial bus (USB) port for connecting the USB connector, various external input ports to be connected to various external terminals such as LAN, and a speaker for outputting sound may be further included in the air conditioner 200.

Figure 6:
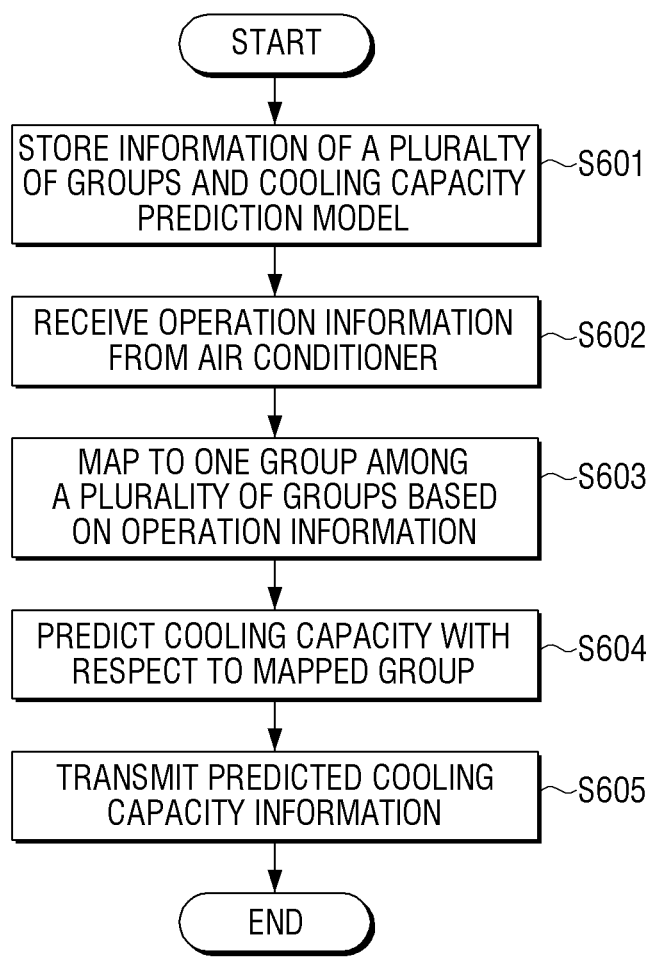
FIG. 6 is a flowchart to describe a controlling method of a server according to an embodiment of the disclosure.

FIG. 6 is a flowchart to describe a controlling method of a server according to an embodiment of the disclosure.

Referring to FIG. 6, information on a plurality of groups and a cooling capacity prediction model corresponding to each of the plurality of groups are stored in operation S601.

The plurality of groups is a group generated by analyzing usage patterns of each air conditioner based on operation information on each of the plurality of air conditioners 200 and grouping air conditioners having similar usage patterns into one group.

The cooling capacity prediction model corresponding to each of the plurality of groups may be an AI model as described above, with respect to the operation of the server 100. The AI model may be a regression model.

The regression model may include linear regression, polynomial regression, decision tree regression, random forest regression, or the like.

In storing the cooling capacity prediction models corresponding to each of a plurality of groups, in addition to storing only the cooling capacity prediction models, a general prediction model for predicting a set temperature or an operation mode corresponding to a given environment may be stored.

Then, the operating information is received from the air conditioner 200 in operation S602. The operation information may include not only the desired temperature, the operation mode, the wind direction, and the wind speed set by the user but also the ambient temperature, the ambient humidity, and the like. In addition, the operational information may include cooling capacity information.

The air conditioner 200 is mapped to one group from among a plurality of groups based on the received operation information in operation S603.

Specifically, based on the received operation information, the cooling capacity of the air conditioner 200 may be calculated, and based on the calculated cooling capacity and the received operation information, the air conditioner 200 may be mapped to one of the plurality of groups.

When information on the cooling capacity is included in the received operation information, the received operation information may be mapped to one group from among a plurality of groups based on the received operation information without a process of calculating the cooling capacity.

Mapping to one group from among a plurality of groups may be performed using the AI model with respect to the operation of the server 100, as described above. To be specific, the AI model may correspond to the classification prediction model which maps the air conditioner to one of the plurality of groups. The classification prediction model may include K-means model, partitioning, K-medoid, CLARA, CLARANS model, or the like.

To be specific, the AI model may learn the usage pattern based on the operation information of each of the plurality of air conditioners, and when the received operation information is input, the AI model may map the air conditioner 200 to one group corresponding to the usage pattern of the air conditioner 200 from among a plurality of groups.

Using the cooling capacity prediction model corresponding to the mapped group, the cooling capacity of the air conditioner 200 is predicted in operation S604.

To be specific, by inputting the received operation information to the cooling capacity prediction model corresponding to the mapped group, cooling capacity prediction information for the given situation may be generated.

Referring to FIG. 6, it is described that the cooling capacity prediction model is used in operation S604. However, in the implementation, the received operation information may be input to a general prediction model corresponding to the mapped group, and prediction information on the set temperature or the operation model for the given situation may be generated.

Information on the predicted cooling capacity is transmitted to the air conditioner 200 in operation S605.

Meanwhile, in FIG. 6, the cooling capacity is predicted using the cooling capacity prediction model in operations S604 and S605, and the predicted cooling capacity is transmitted to the air conditioner 200. However, in implementation, the prediction model itself may be transmitted to the air conditioner 200.

Specifically, the prediction model or the cooling capacity prediction model corresponding to the mapped group may be transmitted to the air conditioner 200, and the air conditioner 200 may directly perform prediction of the operation in the given situation using the received prediction model or the cooling capacity prediction model.

In implementation, with respect to the operation of the server 100, the control data corresponding to the predicted cooling capacity may be generated, and the generated control data may be transmitted to the air conditioner 200.

Specifically, a cooling capacity for the air conditioner 200 may be predicted based on the cooling capacity prediction model corresponding to the mapped group and the received operation information, control data on the air conditioner 200 corresponding to the predicted cooling capacity may be generated, and the generated control data may be transmitted to the air conditioner 200.

Ahead of storing a prediction model corresponding to each of the plurality of groups or a cooling capacity prediction model, a prediction model corresponding to each of a plurality of groups may be generated.

Specifically, the operation information for each of the plurality of air conditioners may be stored, and a prediction model corresponding to the corresponding group may be generated using the operation information of the air conditioners belonging to the plurality of groups. At this time, the prediction model may correspond to a regression model.

When operation information is received from the air conditioner 200 after a prediction model corresponding to a plurality of groups is generated and stored, a prediction model on the mapped group may be generated by using the operation information corresponding to the group to which the air conditioner 200 is mapped and the received operation information, from among the stored operation information of the air conditioner.

Based on the received operation information, a prediction model corresponding to the mapped group may be updated, and the cooling capacity of the air conditioner 200 may be predicted Therefore, in the server control method of the disclosure, air conditioners having similar usage patterns are grouped based on operation information of the air conditioners, and a prediction model is calculated using operation information of air conditioners belonging to each group. Therefore, a prediction model having high accuracy may be generated even with a small amount of resources, compared to generating a prediction model for each air conditioner. The control method as shown in FIG. 6 may be executed on a server having the configuration of FIG. 2 or FIG. 3, or on a server having other configurations.

The control method as described above may be implemented as at least one execution program to execute the aforementioned control method, and the execution program may be stored in a non-transitory readable medium.

The non-transitory readable medium is not a medium for storing data for a short time such as a register, cache or memory, but refers to a medium that semi-permanently stores data and may be read by a device. Specifically, programs for performing various methods described above may be stored in the non-transitory readable medium may include a compact disc (CD), digital versatile disc (DVD), hard disk, Blu-ray disc, USB, memory card, ROM, and the like, and provided.

Figure 7:
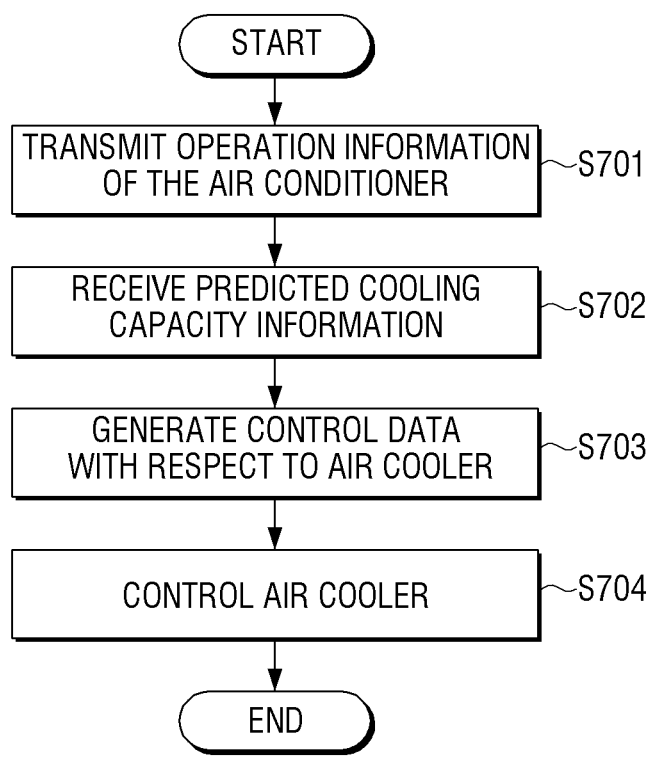
FIG. 7 is a flowchart to describe a controlling method of the air conditioner according to an embodiment of the disclosure.

FIG. 7 is a flowchart to describe a controlling method of the air conditioner according to an embodiment of the disclosure.

Referring to FIG. 7, the operation information of the air conditioner 200 is transmitted to the server 100 in operation S701. To be specific, in addition to the desired temperature, the operating mode, the wind direction, and the wind speed set by the user, the ambient temperature and the ambient humidity may be included. In addition, the user's setting information regarding the function of the air conditioner 200, and the information on the ambient environment around the air conditioner 200 may be included. Further, the air conditioner 200 may calculate the cooling capacity using at least one of the set temperature, the operation mode information and the wind volume information, and transmit the calculated cooling capacity.

Information on the predicted cooling capacity is received from the server 100 based on the transmitted operation information in operation S702. Specifically, when the operation information of the air conditioner 200 is transmitted to the server 100, a prediction model may be generated based on the operation information transmitted by the server 100 as described above with reference to FIG. 6, and the cooling capacity predicted using the prediction model may be received from the server 100.

Using the received cooling capacity information, control data regarding the air cooler is generated in operation S703. Based on the generated control data, the air cooler is controlled in operation S704.

With respect to operations S702 to S704, as another embodiment other than the method of receiving the cooling capacity from the server 100 to generate the control data, a method of receiving a prediction model corresponding to the operation information transmitted from the server 100 or the cooling capacity prediction model itself may be applied. The prediction information may be acquired using the received prediction model or the cooling capacity prediction model, or the cooling capacity may be predicted. When the prediction information is acquired, an operation corresponding thereto may be performed, and when the predicted cooling capacity is acquired, the control data corresponding thereto may be generated using the predicted cooling capacity.

As another embodiment, when the server 100 generates control data using the prediction model, a method of receiving the generated control data may be applied. In this case, the air cooler may be controlled based on the received control data.

Therefore, the control method of the air conditioner of the disclosure may control the air cooler by receiving the cooling capacity information predicted from the server and converting the information into the corresponding control data. As a result, it is possible to control the air cooler to perform an operation suitable for a given situation without receiving various information such as the set temperature, operation mode, or the like. The control method as shown in FIG. 7 may be executed on the air conditioner having the configuration of FIG. 4 or FIG. 5, or on an air conditioner having other configurations.

The aforementioned control method may be implemented as one execution program to execute the aforementioned control method, and the execution program may be stored in a non-transitory readable medium.

Figure 8:
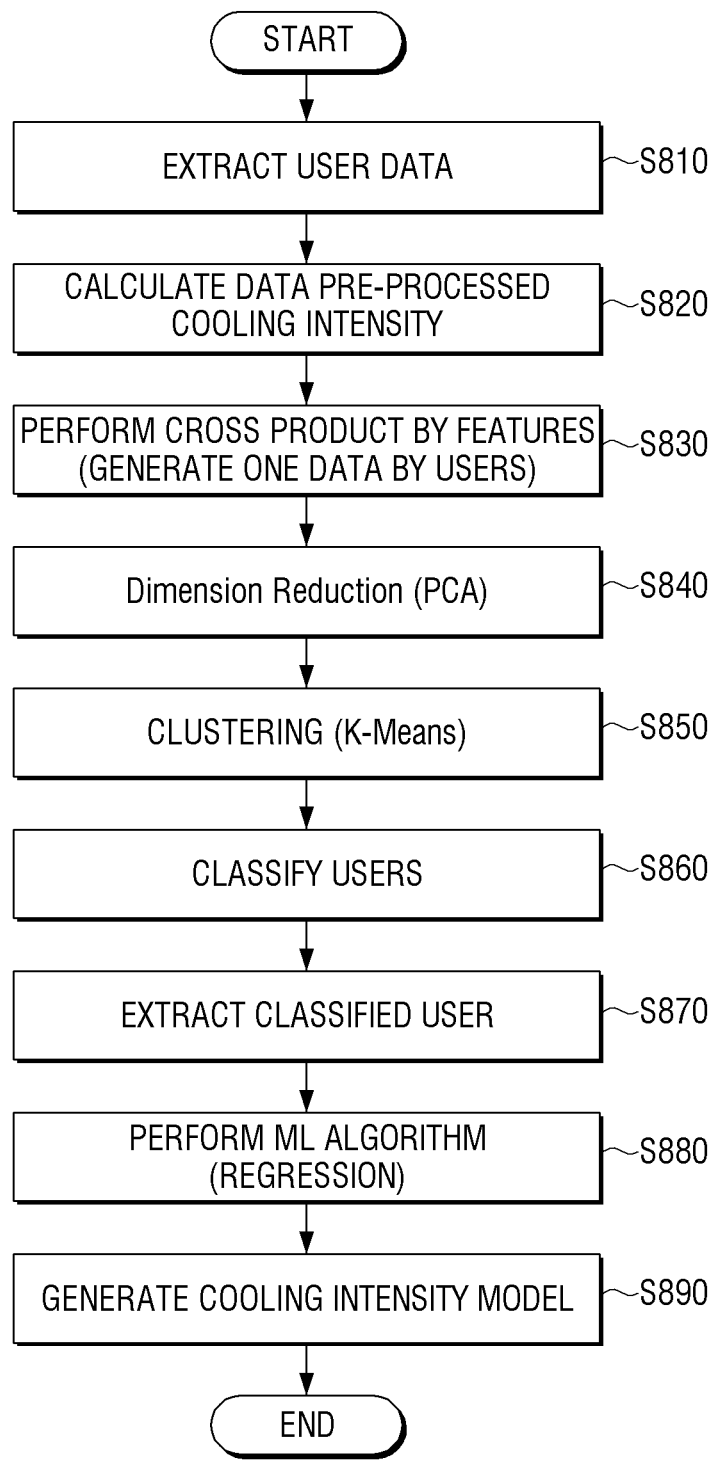
FIG. 8 is a flowchart to specifically describe a mapping process and a learning process according to an embodiment of the disclosure.

FIG. 8 is a flowchart to specifically describe a mapping process and a learning process according to an embodiment of the disclosure.

The operation information of the plurality of air conditioners 200 may be extracted in operation S810.

Data preprocessing may be performed with respect to the extracted operation information of each of the plurality of air conditioners and cooling capacity information may be calculated using the pre-processed operation information in operation S820. Here, the method of calculating the cooling capacity will be described with respect to FIG. 9.

A cross product may be performed on the cooling capacity information and the operation information of each of the plurality of users in operation S830. Specifically, when feature spaces for features are defined with respect to a range of values of each feature of the calculated cooling capacity information and the operation information, and the cross product for the entire features is performed, a multi-dimensional feature space is generated. In the multi-dimensional feature space, each event of the air conditioner may be represented as a single point. Therefore, when the entire event of the air conditioner is spread on the feature space and normalization is performed, it may be defined as the usage pattern of the air conditioner.

Dimension reduction may be performed in operation S840. Specifically, when the usage pattern of the air conditioner is analyzed using the cooling capacity information of the entire events of the air conditioner deployed on the feature space, an excessive amount of calculation is required due to the multi-dimensional feature space. Therefore, the amount of computation can be reduced by reducing the dimension of the multi-dimensional feature space.

More specifically, dimension reduction may be performed by principal component analysis (PCA). The PCA is a statistical method of finding the direction vector with the greatest variance of data and marking it as the component that best represents the characteristics of the data. Therefore, it is possible to reduce the dimension by extracting only the main feature that has real influence in the multidimensional feature space.

With respect to the reduced operation information of the air conditioners, the air conditioners may be classified into a plurality of groups (that is, clustering) in operations S850 to S860. To be specific, in consideration of the features of the reduced information, groups (cluster) having similar features may be defined.

For example, clustering may include a K-means model. The K-Means model is a method of dividing data into K groups. The Euclidean distance may be calculated to form a group that minimizes the cost function such as dissimilarity between groups. Therefore, it is possible to form groups having information with high similarity using K-means and similar users may form a group. The number of groups may be diverse such as 5, 10, 15, or the like, and the number of groups may be received from the user of the server.

Operation information of the air conditioners belonging to each of the plurality of groups may be extracted in operation S870. For example, when the air conditioner 1, air conditioner 2, and air conditioner 3 belong to group 1, the operating information of air conditioner 1, air conditioner 2, and air conditioner 3 may be extracted.

A machine learning algorithm may be performed using the extracted operation information per group in operation S880. Specifically, the machine learning algorithm may correspond to a regression model that models the correlation between dependent variable and independent variable.

The regression model may be linear regression, polynomial regression, decision tree regression, random forest regression, or the like.

Using the above-described machine learning algorithm, it is possible to learn a prediction model that links the ambient environmental information within the operation information and the user setting information within the operation information by setting the ambient environmental information as an observation value and by setting the user setting information as a target value.

The cooling capacity prediction model may be generated in operation S890. When the cooling capacity information is set as the target value in operation S880, a model for predicting the cooling capacity may be generated. Also, since operations S870 to S890 are performed for each group, a cooling capacity prediction model corresponding to each group may be generated.

As such, by using the operation information of a plurality of air conditioners and machine learning, it is possible to form a plurality of groups of air conditioners having similar usage patterns, and generate a cooling capacity prediction model for each of a plurality of groups. The prediction model is formed by using the information of the group consisting of the air conditioners having the similar usage pattern and thus, the model overfitting problem due to lack of operation information when a model is generated for individual air conditioners, and the problem of excessive overhead of the batch process due to generation of individual models may be solved.

FIG. 9 is a view illustrating an example of a cooling capacity calculation according to an embodiment of the disclosure. FIG. 9 may have a premise that the server 100 calculates a cooling capacity using the received operation information, or the air conditioner 200 calculates the cooling capacity using the operation information and transmits the calculated cooling capacity to the server 100.

Referring to FIG. 9, the table displays a mode, co-mode, speed level, and cooling capacity value with respect to the operation of the air conditioner 200.

The mode is a value for the operation mode of the air conditioner 200, and may include a cool mode for performing a cooling function, a dry mode for performing a dehumidification function, or a wind mode for performing a blowing function. In addition, the co-mode is an additional operation mode performed together with the operation of the mode, and may include a sleep mode which the user may use when sleeping. Also, the speed level is a value for the wind speed level and may have a value from among 0, 1, 2, 3, or 4, and the wind speed level may have fewer or more levels.

The cooling capacity represents a cooling capacity which means a value of the capacity of the cooling system to remove heat.

Referring to the table of FIG. 9, the server 100 or the air conditioner 200 may calculate the cooling capacity of the air conditioner 200 using the operation information, additional operation mode information, wind speed information, or the like within the received operation information.

For example, when the received operation information includes information on the operation in the cool mode and the sleep mode, the server 100 or the air conditioner 200 may confirm that the operation of the air conditioner 200 corresponds to an operation of No. 1 of FIG. 9 and may determine that the cooling capacity of the air conditioner 200 is 10800.

Although FIG. 9 illustrates the feature of calculating the cooling capacity using the mode, co-mode, and speed level values, this is only an example, and in implementation, information about the current temperature, set temperature, the difference between the set temperature and the current temperature, the current humidity or the set humidity may also be used, and the cooling capacity may be calculated using various combinations of the above information.

Figure 10:
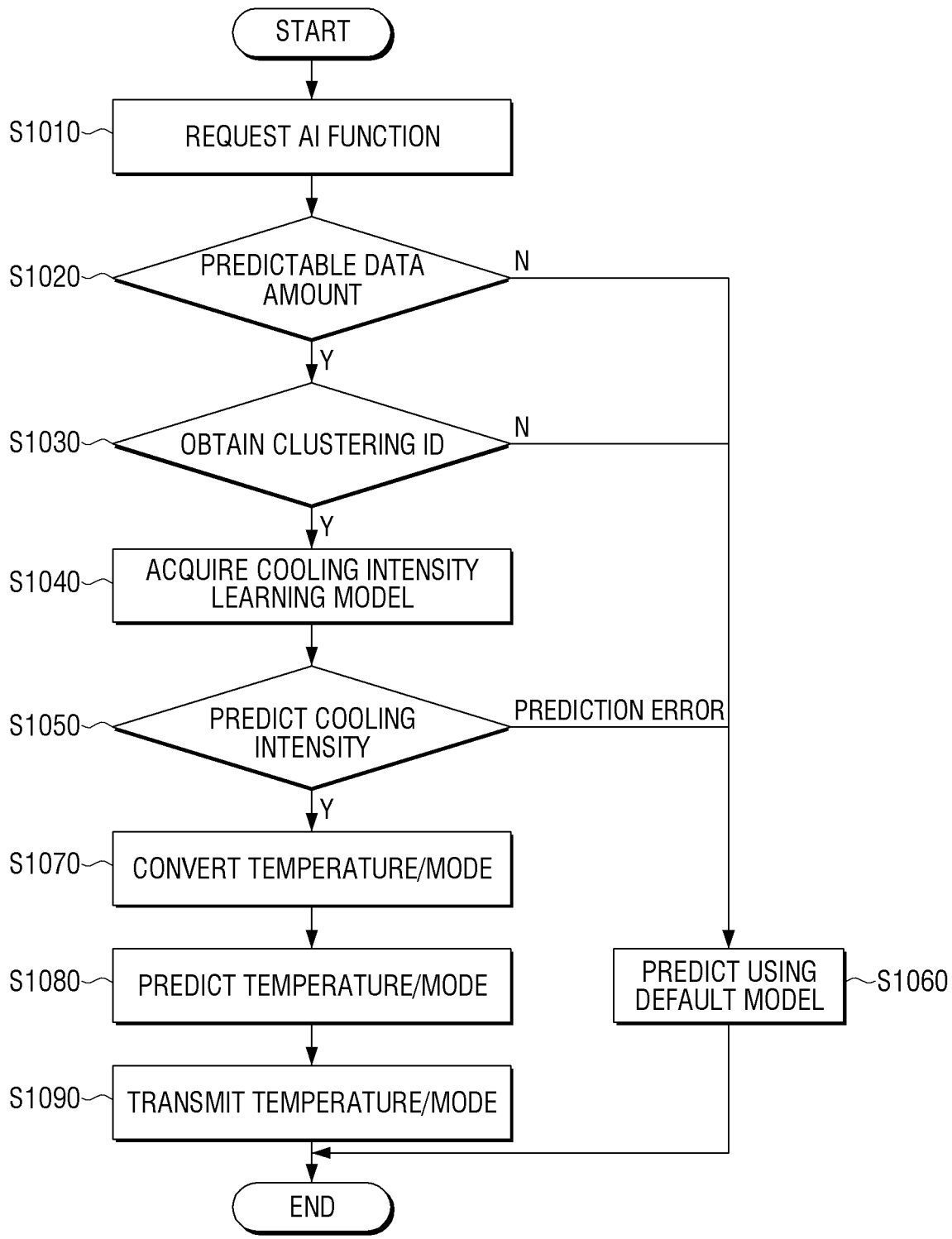
FIG. 10 is a flowchart to specifically describe a prediction process according to an embodiment of the disclosure.

FIG. 10 is a flowchart to specifically describe a prediction process according to an embodiment of the disclosure.

The server 100 may predict an operation suitable for a given situation through the communication with the air conditioner 200.

First, the server 100 may receive a request for an AI function from the air conditioner 200 in operation S1010. Here, the AI function refers to a function of predicting an operation corresponding to a given situation based on the existing operation information of the air conditioner 200.

The server 100 may confirm whether the data amount required for performing prediction is sufficient in operation S1020.

Specifically, the server 100 generates prediction information using an AI model, that is, a prediction model, as described above with respect to the operation of the server 100. However, prior to this, the server requires learning based on the operation information of a plurality of air conditioners in order to generate a prediction model. However, if the number of operation information of the plurality of air conditioners is not large, learning of the prediction model may not be sufficiently performed, and as a result, a prediction model with high accuracy may not be generated. Accordingly, the server 100 may confirm whether there is a sufficient number of operation information for performing the prediction prior to performing the prediction.

In this case, the criterion that the amount of data necessary for performing the prediction is sufficient may represent whether the predetermined number is satisfied, and the predetermined number may be determined according to the result of the repeated experiments.

If the amount of data is insufficient in operation S1020-N, since the cooling capacity prediction model may not be secured, the server 100 may perform the prediction using the default model in operation S1060. Here, the default model is a preliminary prediction model used when the cooling capacity prediction model may not be obtained from the server 100. The default model may be pre-stored in the air conditioner 200 and may be used when the default model is required. In addition, the default model may be directly transmitted from the server 100 to the air conditioner 200. When the server 100 performs the prediction using the default model, the server 100 may transmit the prediction result to the air conditioner 200.

Conversely, if the data amount is sufficient in operation S1020-Y, it may be confirmed whether clustering identifier (ID) is acquired in operation S1030. The clustering ID is a name for each of a plurality of groups. That is, the case where the clustering ID may not be obtained may correspond to the case where the clustering ID is not matched to any one of the plurality of groups.

If the clustering ID is not obtained in operation S1030-N, the cooling capacity prediction model corresponding to a specific cluster may not be utilized, so that the prediction may be performed using the default model in operation S1060.

Conversely, if the clustering ID is obtained in operation S1030-Y, the cooling capacity prediction model corresponding to the cluster may be acquired in operation S1040. For example, in the case of belonging to group 1, it is possible to acquire the cooling capacity prediction model 1 corresponding to group 1.

The server 100 may predict a cooling capacity suitable for the current situation using the acquired cooling capacity prediction model in operation S1050. If an error occurs in the prediction process, the prediction may be performed using the default model in operation S1060.

The server 100 may convert the predicted cooling capacity into the temperature information or the mode information in operation S1070, predict the set temperature information or the set mode information using the converted temperature information or the mode information in operation S1080, and transmit the predicted set temperature information or set mode information to the air conditioner 200 in S1090.

Converting to the temperature information or mode information using the cooling capacity will be described with respect to FIG. 11.

When a request for a prediction model is received from the air conditioner 200, the server 100 may identify the group to which the air conditioner 200 belongs and provide the corresponding cooling capacity prediction model, and may provide a prediction model having higher accuracy than that of providing the prediction model generated for each of the air conditioners 200 according to the related art.

FIG. 11 is a view illustrating an example of the operation mode and temperature calculation according to an embodiment of the disclosure. FIG. 11 illustrates a case where the server 100 generates the control data for the air conditioner 200 using the predicted cooling capacity, the air conditioner 200 receives the predicted cooling capacity from the server 100, and the control data is generated using the predicted cooling capacity.

Referring to FIG. 11, the table displays cooling capacity, mode, and temp (cT-dT) with respect to prediction of the operation of the air conditioner 200.

The cooling capacity is a cooling index, meaning a value of capacity to remove heat by the cooling system.

The mode is a value for the operation mode of the air conditioner 200, and may include a cool mode for performing a cooling function, a dry mode for performing a dehumidification function, or a wind mode for performing a blowing function. Also, temp (cT-dT) represents a difference value between a current temperature and a desired temperature.

The server 100 or the air conditioner 200 may calculate the control data on the operation of the air conditioner 200 by using the predicted cooling capacity with reference to the table of FIG. 11.

For example, referring to FIG. 11, when the predicted cooling capacity has a value of 4000, a corresponding operation is to set a temperature which is two degrees lower than the current temperature as a desired temperature, and operates in a dry mode. Accordingly, the server 100 may generate control data for controlling the air conditioner 200 to be operated in the dry mode and at the temperature two degrees lower than the current temperature, and transmit the control data to the air conditioner 200. The air conditioner 200 may generate the control data for controlling the air conditioner 200 to operate in the dry mode and at the temperature that is two degrees lower than the current temperature.

Meanwhile, the table of FIG. 11 referred to when the server 100 or the air conditioner 200 generates the control data corresponding to the predicted cooling capacity is only one embodiment, and variety methods may be used for calculation of the control data, and the control data may be determined according to the results of repeated experiments.

In addition, although FIG. 11 illustrates and describes calculating the cooling capacity using the mode, co-mode, and speed level values, in implementation, information about the current temperature, set temperature, the difference value between the set temperature and the current temperature, the current humidity or the set humidity may also be used, and the cooling capacity may be calculated using various combinations of the above information.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. A server comprising:
   a communication device configured to receive operation information from an air conditioner;
   a memory configured to store information of a plurality of groups and a cooling capacity prediction model for predicting a cooling capacity that corresponds to each of the plurality of groups; and
   a processor configured to:
      map the air conditioner to one group among the plurality of groups based on the received operation information, and
      control the communication device to enable the air conditioner to use the cooling capacity prediction model corresponding to the mapped group.

2. The server of claim 1,
   wherein the received operation information comprises at least one of temperature information, operation mode information, or wind volume information, and
   wherein the processor is further configured to:
      calculate the cooling capacity of the air conditioner based on the received operation information, and
      map the air conditioner to one group among the plurality of groups based on the calculated cooling capacity and the received operation information.

3. The server of claim 1,
   wherein the memory is further configured to store a classification prediction model that maps the air conditioner to the one group among the plurality of groups, and
   wherein the processor is further configured to map the air conditioner to the one group among the plurality of groups using the received operation information and the classification prediction model.

4. The server of claim 3, wherein the classification prediction model is a K-means model.

5. The server of claim 1,
   wherein the memory is further configured to store operation information of each of a plurality of air conditioners, and
   wherein the processor is further configured to generate the cooling capacity prediction model for each of the plurality of groups using the operation information of the air conditioner corresponding to each of the plurality of groups.

6. The server of claim 5, wherein the cooling capacity prediction model is a decision tree regression model.

7. The server of claim 5, wherein the processor is further configured to generate the cooling capacity prediction model for the mapped group using the operation information corresponding to the mapped group from among the stored operation information of the air conditioner and the received operation information.

8. The server of claim 5, wherein the processor is further configured to:
   control the communication device to update the cooling capacity prediction model corresponding to the mapped group based on the received operation information, and
   control the communication device to enable the air conditioner to use the updated cooling capacity prediction model.

9. The server of claim 1, wherein the processor is further configured to control the communication device to transmit the cooling capacity prediction model corresponding to the mapped group to the air conditioner.

10. The server of claim 1, wherein the processor is further configured to:
predict the cooling capacity of the air conditioner based on the cooling capacity prediction model corresponding to the mapped group and the received operation information, and
control the communication device to transmit information on the predicted cooling capacity to the air conditioner.

11. The server of claim 1, wherein the processor is further configured to:
predict the cooling capacity of the air conditioner based on the cooling capacity prediction model corresponding to the mapped group and the received operation information,
generate control data on the air conditioner corresponding to the predicted cooling capacity, and
control the communication device to transmit the generated control data to the air conditioner.

12. An air conditioner comprising:
an air cooler configured to perform air conditioning;
a communication device configured to communicate with a server; and
a processor configured to:
control the communication device to transmit operation information of the air conditioner to the server,
receive information on a cooling capacity predicted based on the transmitted operation information,
generate control data on the air cooler based on the received information on the cooling capacity, and
control the air cooler based on the generated control data.

13. The air conditioner of claim 12, wherein the operation information comprises at least one of temperature information, operation mode information, or wind volume information.

14. A controlling method of a server, the method comprising:
storing information of a plurality of groups and a cooling capacity prediction model for predicting a cooling capacity that corresponds to each of the plurality of groups;
receiving operation information from an air conditioner;
mapping the air conditioner to one group among a plurality of groups based on the received operation information;
predicting a cooling capacity of the air conditioner using the cooling capacity prediction model corresponding to the mapped group; and
transmitting information on the predicted cooling capacity to the air conditioner.

15. The method of claim 14,
wherein the operation information comprises at least one of temperature information, operation mode information, or wind volume information, and
wherein the mapping comprises:
calculating the cooling capacity of the air conditioner based on the received operation information, and
mapping the air conditioner to one group among the plurality of groups based on the calculated cooling capacity and the received operation information.

16. The method of claim 14, wherein the mapping comprises mapping the air conditioner to one group among the plurality of groups using the classification prediction model which maps the air conditioner to one group among the plurality of groups and the received operation information.

17. The method of claim 14, further comprising:
storing operation information of each of a plurality of air conditioners; and
generating the cooling capacity prediction model for each of the plurality of groups using the operation information of the air conditioner corresponding to each of the plurality of groups.

18. The method of claim 17, wherein the generating of the cooling capacity prediction model comprises generating the cooling capacity prediction model for the mapped group using the operation information corresponding to the mapped group from among the stored operation information of the air conditioner and the received operation information.

19. The method of claim 17, further comprising:
updating the cooling capacity prediction model corresponding to the mapped group based on the received operation information,
wherein the predicting comprises predicting the cooling capacity of the air conditioner using an updated cooling capacity prediction model.

20. The method of claim 14, wherein the transmitting of the information on the predicted cooling capacity to the air conditioner comprises:
generating control data on the air conditioner corresponding to the predicted cooling capacity, and
transmitting the generated control data to the air conditioner.

* * * * *